(12) United States Patent
Marques et al.

(10) Patent No.: US 10,601,369 B2
(45) Date of Patent: Mar. 24, 2020

(54) CRYSTAL OSCILLATOR STARTUP TIME OPTIMIZATION

(71) Applicant: SILICON LABORATORIES INC., Austin, TX (US)

(72) Inventors: Tiago Marques, Austin, TX (US); Chester Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/032,348

(22) Filed: Jul. 11, 2018

(65) Prior Publication Data

US 2020/0021244 A1    Jan. 16, 2020

(51) Int. Cl.
*H03B 5/06* (2006.01)
*H03L 3/00* (2006.01)
*H03B 5/36* (2006.01)

(52) U.S. Cl.
CPC .............. *H03B 5/06* (2013.01); *H03B 5/36* (2013.01); *H03L 3/00* (2013.01); *H03B 2200/0094* (2013.01)

(58) Field of Classification Search
CPC ... H03B 5/36; H03B 5/06; H03B 5/32; H03B 2200/005; H03B 2200/0094; H03L 3/00; G06F 1/14; G06F 1/04
See application file for complete search history.

(56) References Cited

U.S. PATENT DOCUMENTS

| | | |
|---|---|---|
| 4,321,562 A | 3/1982 | Igarashi |
| 4,896,122 A | 1/1990 | Tahernia et al. |
| 4,956,618 A | 9/1990 | Ulmer |
| 5,041,802 A | 8/1991 | Wei et al. |
| 5,208,558 A | 5/1993 | Shigehara et al. |
| 5,416,445 A | 5/1995 | Narahara |
| 5,453,719 A | 9/1995 | Narahara |
| 5,900,787 A | 5/1999 | Yoshimura |
| 5,912,594 A | 6/1999 | Burkhard |
| 6,094,105 A | 7/2000 | Williamson |

(Continued)

OTHER PUBLICATIONS

Stephens, Ransom. "The Future of Multi-Clock Systems." Frequency Controls, Inc. 2007 pp. 1-14.

(Continued)

*Primary Examiner* — Ryan Johnson
(74) *Attorney, Agent, or Firm* — Gary Stanford Huffman Law Group, PC (57) ABSTRACT

An oscillation circuit including a crystal interface, a crystal amplifier, a level detector, a timing circuit, and a controller. When activated, the crystal amplifier drives a crystal coupled to the crystal interface to establish oscillation, and the level detector indicates when a target amplitude is detected. The controller activates the crystal amplifier and uses the timing circuit and the level detector to measure a startup time of oscillation. The measured startup time is used in calculating a wake up time from a sleep mode in time to perform an operation at a scheduled time. The startup time may be adjusted or averaged and may be remeasured with temperature change. A method of minimizing startup time of a crystal oscillator includes measuring startup time for determining a delay value for programming a wakeup circuit. Robust startup settings may be used in the event of startup failure due to a sleepy crystal.

20 Claims, 6 Drawing Sheets

(56) References Cited

U.S. PATENT DOCUMENTS

| | | |
|---|---|---|
| 6,097,257 A | 8/2000 | Kadowaki et al. |
| 6,133,801 A | 10/2000 | Tanaka |
| 6,653,908 B1 | 11/2003 | Jones |
| 6,696,899 B2 | 2/2004 | Ruffieux |
| 6,782,485 B2 | 8/2004 | Takai |
| 6,873,215 B2 * | 3/2005 | Devries .................. G06F 1/14 327/141 |
| 7,034,628 B1 | 4/2006 | Lu et al. |
| 7,348,861 B1 | 3/2008 | Wu et al. |
| 7,808,334 B2 | 10/2010 | Yoshida et al. |
| 7,868,710 B1 | 1/2011 | Farahvaash et al. |
| 7,961,060 B1 | 6/2011 | McMenamy et al. |
| 8,324,978 B2 | 12/2012 | Loeda |
| 8,395,456 B2 | 3/2013 | Badillo et al. |
| 9,614,509 B1 | 4/2017 | Ahmed |
| 2004/0169562 A1 | 9/2004 | Novac |
| 2005/0017812 A1 | 1/2005 | Ashida et al. |
| 2008/0211592 A1 | 9/2008 | Gaussen |
| 2009/0002087 A1 | 1/2009 | Toffolon et al. |
| 2009/0096541 A1 | 4/2009 | Tran |
| 2009/0121799 A1 | 5/2009 | Ishikawa |
| 2011/0037527 A1 | 2/2011 | Shrivastava et al. |
| 2011/0291767 A1 | 12/2011 | Ishikawa et al. |
| 2012/0242418 A1 | 9/2012 | Takahashi |
| 2013/0154754 A1 | 6/2013 | Frank |
| 2014/0035689 A1 | 2/2014 | Ozawa et al. |
| 2014/0091872 A1 | 4/2014 | Itasaka |
| 2014/0320223 A1 | 10/2014 | Ozawa et al. |
| 2016/0072438 A1 | 3/2016 | Fukahori |
| 2019/0006990 A1 | 1/2019 | Marques et al. |
| 2019/0006991 A1 | 1/2019 | Marques et al. |
| 2019/0006992 A1 | 1/2019 | Marques |
| 2019/0007005 A1 | 1/2019 | Marques |
| 2019/0007012 A1 | 1/2019 | Marques |

OTHER PUBLICATIONS

Marques, Tiago. Patent Application filed with the USPTO on Jun. 30, 2017 and receiving U.S. Appl. No. 15/639,038.

* cited by examiner

CRYSTAL OSCILLATOR STARTUP TIME OPTIMIZATION

CROSS REFERENCE TO RELATED APPLICATION(S)

This application is related to the following U.S. Patent Application which is filed concurrently herewith and which is hereby incorporated by reference in their entireties for all intents and purposes.

| ATTORNEY DOCKET NUMBER | SERIAL NUMBER | FILING DATE | TITLE |
|---|---|---|---|
| SLL.0120B | 16/032387 | Jul. 11, 2018 | CRYSTAL OSCILLATOR ADAPTIVE STARTUP ENERGY MINIMIZATION |

BACKGROUND OF THE INVENTION

Field of the Invention

The present invention relates in general to crystal oscillators, and more particularly to a system and method of optimizing startup time of a crystal oscillator.

Description of the Related Art

A wireless device operating in certain wireless networks, such as Wi-Fi or Bluetooth or the like, operates in a sleep mode or other low power mode in order to save power when not communicating. The device wakes up at certain intervals in order to transmit (TX) and/or receive (RX) information, and then goes back to sleep until the next RX/TX communication interval. Such a system typically uses a crystal oscillator to establish a reference frequency. A crystal oscillator uses the mechanical resonance of a crystal to create an oscillation signal having a precise frequency. The crystal oscillator also includes a crystal amplifier that provides a "negative" resistance to cancel the losses of the crystal to establish and maintain oscillation. Upon each wake up event, the crystal oscillator is powered up in advance to achieve stable oscillation at the target reference frequency to enable RX/TX communications at the scheduled time.

The startup time of the crystal oscillator depends on the selected crystal. The physical properties may vary somewhat from one crystal to another and may vary widely for different crystal types or even among different manufacturers. A provider or manufacturer of a wireless transceiver semiconductor device or integrated circuit (IC) that incorporates the crystal amplifier may specify a set of allowed crystals or crystal types that may be used with the IC. Conventionally, in order to guarantee stable oscillation, a significant amount of laboratory time has been expended to test multiple crystal types from different manufacturers to identify a worst case startup time. The worst case startup time had to include a significant margin to account for crystal variations and process variations and well as operating condition variations, such as variations in voltage, current, temperature, etc. Thus, the worst case startup time incorporated a relatively wide margin of time, which resulted in higher energy consumption and lower battery life of the wireless device or wireless system or any type of electronic system using the crystal oscillator.

SUMMARY OF THE INVENTION

An oscillation circuit that drives an externally coupled crystal to oscillate at a resonant frequency according to one embodiment includes a crystal interface, a crystal amplifier, a level detector, a timing circuit, and a controller. When activated, the crystal amplifier is capable of driving a crystal coupled to the crystal interface to initiate and maintain oscillation. The level detector provides an oscillation indication when a target amplitude is detected. The controller activates the crystal amplifier and uses the timing circuit and the level detector to measure a startup time of oscillation, in which the measured startup is used in calculating a wake up time to wake up from a sleep mode in time to perform an operation at a scheduled time.

A memory may be included, in which the controller stores the startup time and uses the stored startup time to calculate a wakeup time for subsequent wake up events. The controller may add a time margin to the measured startup time and store the result as the stored startup time used in calculating the wake up time. The controller may remeasure and update the stored startup time upon detecting a temperature change by a predetermined amount. The controller may replace the stored startup time with a newly measured startup time when the newly measured startup time is greater than the stored startup time, or the controller may reduce the stored startup time when the newly measured startup time is less than the stored startup time. The controller may average multiple measured startup times for updating the stored startup time.

The controller may retrieve and apply optimal settings stored in the memory to the crystal amplifier to control activating the crystal. The controller may use the timing circuit to detect when oscillation fails, such when the timing circuit times out, and instead retrieves and applies robust settings stored in the memory to the crystal amplifier to control activating the crystal. The robust settings can be used only once when oscillation failure is detected, and then operation can return to using the optimal settings.

A wireless device according to one embodiment includes a memory, a wakeup circuit, an oscillation circuit, and a processor, in which the oscillation circuit includes a crystal oscillator, a level detector, a timing circuit, and a controller. The controller may activate the crystal amplifier and use the timing circuit and the level detector to measure a startup time of the crystal oscillator, and then store the startup time into the memory. The processor programs the wakeup circuit with a wakeup value based on a scheduled communication session time and the stored startup time. The wakeup value may further take into account other measured or known startup times for other circuits or components.

The controller may add a time margin to the measured startup time to provide an adjusted startup time, and store adjusted startup time into the memory as the stored startup time used for determining the wakeup value. The controller may update the stored startup time based on newly measured startup times during subsequent wakeup events. The controller may replace the stored startup time with a newly measured startup time when the newly measured startup time is greater than the stored startup time, or may reduce said stored startup time by an incremental amount when the newly measured startup time is less than the stored startup time. The controller may determine an averaged startup time using a multiple measured startup times and store the averaged startup time as the stored startup time. The processor may detect temperature, and may remeasure and update the stored startup time when temperature changes by a predetermined amount.

The controller may use optimal settings for activating the crystal oscillator, may detect failure when the timing circuit times out, and may instead use robust settings for activating the crystal oscillator in the event the crystal oscillator fails to startup using the optimal settings.

A method of minimizing startup time of a crystal oscillator in order to perform a scheduled operation according to one embodiment includes activating the crystal oscillator, determining a startup time by measuring a time from activation to when an indication is provided indicating that an oscillation signal of the crystal oscillator achieves a predetermined amplitude, storing the startup time, and using the startup time to determine a delay value for programming a wakeup circuit.

The method may include adding a time margin to the measured start time to determine the stored startup time. The method may include averaging multiple measured startup times and storing an averaged startup time as the stored startup time. The method may include remeasuring startup time and updating the stored startup time upon detecting a temperature change by a predetermined amount. The method may include activating the crystal oscillator using optimal settings, detecting when the crystal oscillator fails to startup, and when the crystal oscillator fails to startup, activating the crystal oscillator using robust settings.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to improve the startup operation of a crystal oscillator by optimizing the startup time. Upon initial power up or reset (POR), the actual startup time of the crystal oscillator is measured, adjusted and stored. The measured startup time is subsequently used to determine when to wakeup a device using the crystal oscillator in advance so that the crystal oscillator may be activated to achieve target oscillation just-in-time for a scheduled operation. A wireless device using the crystal oscillator, for example, may schedule wireless communications at a subsequent time. The wireless device uses the measured startup time to determine when to wakeup the device in advance so that the crystal oscillator achieves stable oscillation to enable the wireless device to perform the wireless communications at the scheduled time. Although startup time may be measured once, adjusted with additional margin time, and then stored and used for subsequent startups, it is understood that the startup time may vary significantly over time and under varying conditions, such as changes in temperature. In one embodiment, the startup time is measured periodically or even for each wakeup event so that the measured startup time may be dynamically adjusted over time.

It is noted that the term "optimize" and its various forms (optimization, optimizing, etc.) as used herein is intended to incorporate factors other than time. It may be possible, for example, to reduce the startup time to an absolute minimum by significantly increasing a core bias current of the crystal amplifier along with adjusting other startup settings or parameters. Such an approach, however, may compromise other important factors, such as startup energy or power consumption. As described herein, certain optimal settings may be determined for the crystal for optimal startup, in which the present case concerns minimizing the startup time given the use of such optimal settings. The optimal settings may be selected to achieve minimal energy consumption, or to optimize startup energy within a given maximum startup time.

The inventors have also recognized that the optimal settings may be insufficient to startup a crystal oscillator with a "sleepy" crystal. In the event of failure of startup of the crystal oscillator, robust settings are used instead to startup the crystal oscillator. It is also observed that once a crystal oscillator is energized into oscillation, it no longer exhibits sleepy characteristics so that the optimal settings may once again be used for subsequent startup events.

Figure 1:
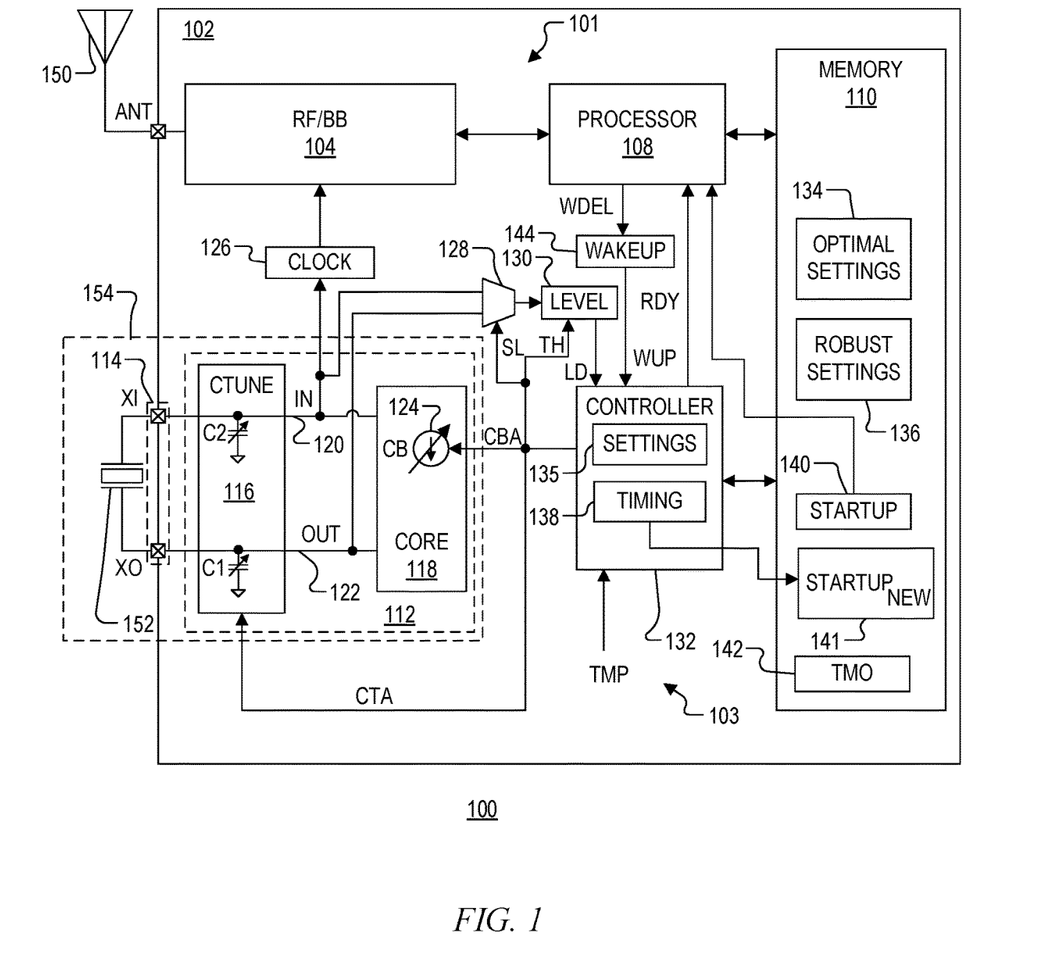
FIG. 1 is a simplified block diagram of a wireless device including a wireless circuit that is capable of optimizing the startup time of a crystal oscillator for wireless communications according to one embodiment.

FIG. 1 is a simplified block diagram of a wireless device 100 including a wireless circuit 102 that is capable of optimizing the startup time of a crystal oscillator 154 for wireless communications according to one embodiment. The wireless device 100 is shown in generalized form for any of various wireless communication configurations, such as Bluetooth®, Zigbee, Wi-Fi, etc. Other functional circuit blocks and circuits may be included for particular applications, but are not shown as not necessary for a full and complete understanding of the present invention. The wireless circuit 102 may be implemented on an integrated circuit (IC) or semiconductor chip or the like, in which the wireless circuit 102 and other components of the wireless device 100 may be mounted on a printed circuit board (PCB) (not shown), a module (not shown), or the like as part of an electronic system.

The wireless device 100 may be included within an electronic system according to any one of various platforms, such as a communication device (hand-held, mobile, stationary, etc.), a computer system (laptop, desktop, server system, etc.), a computer peripheral device (e.g., printer, router, etc.), or any other system or device that may be networked together via wired and/or wireless communications. The present disclosure contemplates the use of the wireless device 100 incorporated within a system that may be part of a suite of components of an Internet of Things (IoT) platform or the like. The components or devices may be powered from an external source (e.g., AC outlet or the like), may be powered by one or more rechargeable or non-rechargeable batteries or battery cells, or may be powered by alternative sources, such as harvested energy, e.g., solar, piezoelectric, biochemical, thermal, etc. Although the present invention is illustrated for use within a wireless communication system, it is understood that the present invention is not limited to communication systems including those performing wireless communications, but instead is generally applicable to any application that uses a crystal oscillator that is repeatedly shut down and reawakened during normal operation to perform any type of function utilizing the crystal oscillator.

The wireless circuit 102 includes a communication system 101 and an oscillation system 103 provided on the same semiconductor chip or IC, though it is understood that the oscillation system 103 may be provided on a separate chip or IC and used in other types of electronic devices using a crystal oscillator (e.g., the crystal oscillator 154). The wireless circuit 102 may include other supporting circuitry not shown, such as power circuitry or the like including a power controller or a power sequencer or the like generally providing support for either or both the communication system 101 and the oscillation system 103.

The wireless device 100 includes the wireless circuit 102, an antenna 150, and a crystal 152, and any other supporting circuitry (not shown). The wireless circuit 102 includes an antenna pin ANT (or other appropriate antenna interface) configured for coupling to the external antenna 150, and a radio frequency and baseband (RF/BB) circuit 104 internally coupled to the antenna pin ANT. The RF/BB circuit 104 is configured to convert digital baseband signals from the processor 108 to RF for transmitting RF signals via the antenna 150, and for converting RF signals received via the antenna 150 into digital baseband signals provided to the processor 108. Although not specifically shown, the RF/BB circuit 104 incorporates analog to digital conversion (ADC) and digital to analog conversion (DAC). Each such receive (RX) and/or transmit (TX) operation is performed during a communication session. A memory 110 is included and coupled to the processor 108. The communication system 101 generally includes the RF/BB circuit 104 with input/output (I/O) coupled via the antenna pin ANT, the processor 108 and the memory 110.

The memory 110 may include any combination of volatile and non-volatile memory for storing data and information, including, for example, various programmable settings, values or parameters. The volatile memory portion of the memory 110 may include, for example, a random access memory (RAM) or the like including registers and the like that may be programmed on the fly during operation for storing run-time data or the like. Information stored in the volatile memory portion (e.g., RAM) is generally lost when power is removed. The non-volatile memory portion of the memory 110 may include, for example, a read-only memory (ROM) or the like that stores permanent information, such as boot-up or run-time routines and values or the like that do not change during operation or when power is removed. The non-volatile memory portion of the memory 110 may also include FLASH memory or the like that stores non-volatile data and information that may be reprogrammed during operation and is not lost when power is removed. The memory 110 is shown at a central location, where it is understood that the memory 110 may include different types of memory distributed in convenient and accessible locations of the wireless circuit 102.

The particular details of operation of the wireless communications are not further described, other than a "sleep" mode or other low power mode, wakeup and activation, and wireless communication scheduling. The wireless circuit 102 is configured to operate in a sleep mode between sequential communication sessions to conserve power. During operation, the wireless device 100 may negotiate with one or more external wireless devices (not shown) in a wireless network via a handshaking protocol or the like, or simply operate according to a predetermined protocol without negotiation. In either case, subsequent RX/TX wireless communications are scheduled ahead of time. The processor 108 may execute a routine or application or the like for scheduling communications (or other operations), or such communications may be scheduled by an external controlling device in the system (not shown) that prompts the processor 108. In the illustrated embodiment, once the next communication session is scheduled, the wireless circuit 102 may be powered down into its sleep mode and remain in sleep mode until the next scheduled communication session. The wireless circuit 102 is awakened sufficiently ahead of time to enable it to perform wireless communications at the next scheduled communication session time, and is placed back into sleep mode after the current communication session has completed and the next communication session is scheduled. It is understood that it is desirable for the wireless circuit 102 to remain in its sleep mode for as long as possible to conserve as much power as possible, but without substantially impacting wireless communications.

The oscillation system 103 of the wireless circuit 102 includes a crystal amplifier 112, a crystal interface 114, a select circuit 128, a level detector 130, a controller 132, and the memory 110. The controller 132 is shown as a separate functional block in the illustrated embodiment, although the control functions may instead be distributed or even part of a larger control function in the system. The memory 110 may be shared with the communication system 101 or separate memory systems may be provided. The crystal interface 114 enables external coupling of the crystal 152 to the oscillation system 103. As shown, the crystal interface 114 includes an amplifier input pin XI and an amplifier output pin XO, in which the crystal 152 includes a pair of terminals externally coupled between XI and XO. It is noted that the crystal amplifier 112 and the crystal 152 are collectively referred to as the crystal oscillator 154. The crystal amplifier 112 includes a tuning capacitor (CTUNE) circuit 116 and an amplifier core 118, which are both coupled to an amplifier input node 120 developing a signal IN and an amplifier output node 122 developing a signal OUT.

The CTUNE circuit 116 includes a first adjustable capacitor C1 coupled between the amplifier output node 122 and a reference node and a second adjustable capacitor C2 coupled between the amplifier input node 120 and the reference node. The reference node develops a suitable positive, negative or zero reference voltage level, such as ground (GND). The capacitance of the capacitors C1 and C2 may be adjusted based on a capacitance adjust value CTA provided by the controller 132 to an adjust input of the CTUNE circuit 116. The amplifier core 118 includes an adjustable current source 124 which develops a core bias (CB) current based on a core bias adjust (CBA) value provided by the controller 132 to its adjust input as further described herein.

The amplifier input node 120 is coupled to the input of a clock circuit 126, which provides one or more clock signals to the RF/BB circuit 104 for enabling wireless communications. It is noted that the amplifier output node 122 may instead be used to provide the oscillation signal to the input of the clock circuit 126. The clock circuit 126 may include additional circuitry (not shown) for developing the clock signals used by the RF/BB circuit 104, such as a squaring buffer, a level shifter, inverters, selectors, buffers, etc. It is understood that the crystal oscillator 154 develops a reference frequency having sufficient accuracy along with noise and power supply rejection ratio (PSR) performance to develop the one or more clock signals used for wireless communications.

The amplifier input and output nodes 120 and 122 are further coupled to respective inputs of the select circuit 128, having an output providing a selected signal to an input of the level detector 130. The level detector 130 outputs a level detect (LD) signal to an input of the controller 132. The select circuit 128 may be implemented as a multiplexer (MUX) or the like receiving a select signal SL from the controller 132 for selecting between XI and XO. The level detector 130 may be implemented as a peak detector, an amplitude detector, a signal level detector for determining the root-mean-square (RMS) level of an input voltage level, an envelope detector, etc. It is noted that the level detector 130 may incorporate the select circuit 128 and receive SL for selecting between XO or XI. Alternatively, the select circuit 128 may be omitted altogether for embodiments in which only XI or XO is monitored. In one embodiment, the level detector 130 asserts LD when a level of a selected one of the amplifier input and output nodes XI or XO reaches a level threshold determined by a threshold value TH provided by the controller 132. The controller 132 is also coupled to the memory 110 for reading and writing data and information in a similar manner as the processor 108.

The crystal amplifier 112 establishes and maintains oscillation of the crystal 152 by generating a negative resistance between XO and XI (coupled across the crystal 152) to develop an oscillating signal. The oscillating signal generally has a sinusoidal waveform, which is provided to an input of the clock circuit 126. The controller 132 retrieves and uses a set of "optimal" settings 134 stored in the memory 110 to adjust one or more settings of the crystal oscillator 154 to establish oscillation. The optimal settings 134 may include, for example, one or more CBA values for adjusting the core bias current developed by the current source 124, one or more CTA values for adjusting the tune capacitors C1 and C2 of the CTUNE circuit 116, one or more TH values used by the level detector 130 for monitoring the amplitude of the oscillation signal, etc. In the illustrated embodiment, the controller 132 may control SL to monitor the amplitude of the oscillation signal on XO or XI, and may further adjust TH accordingly. In an alternative embodiment, only one of XO or XI is monitored. The controller 132 may include an internal settings memory 135 for storing settings retrieved from the memory 110, such as the optimal settings 134 or a set of "robust" settings 136. The robust settings 136 may include similar setting types as the optimal settings 134, such as one or more CBA values, one or more CTA values, one or more TH values, etc., with one or more different setting values to more likely ensure oscillation described further herein.

The startup process is not further described, but generally includes starting with a relatively high value of core bias current via CBA until oscillation is achieved. Once oscillation is determined to be achieved, the controller 132 adjusts CBA to reduce the core bias current to a steady state level. In one embodiment, the steady state current level of the core bias current is known beforehand. In a single phase embodiment, the controller 132 selects either XI or XO with a final setting of TH and applies a selected core bias current level until the final target amplitude of the oscillation signal is achieved. In a dual phase embodiment, the controller 132 can select XI or XO during different stages of the startup like for example selecting XO during a first phase of startup (at high core bias current level) with a corresponding intermediate setting of TH, or THo, and when THo is achieved, the controller 132 could switch to monitor XI during a second phase of startup (at reduced core bias current) with a corresponding final setting of TH, or THi, representing the final target amplitude of the oscillation signal. In other multi-phase embodiments with more complex crystal power up algorithms, there could be multiple amplitude detections in which CBA, TH, SL may be changed in a cascade of events. The multiple stages can be used to further optimize the crystal startup, energy or startup time. The controller or processor may use these multiple LD events to start other parts of the circuit.

Once the target amplitude is established and the oscillation signal is stabilized, the startup process is completed. The settings may also include a previously determined CBA value used for steady state operation. In one embodiment, the controller 132 may further perform an automatic gain control (AGC) process or the like on a periodic basis or in response to some other trigger, such as a significant change in temperature, to determine and/or adjust the steady state level of the core bias current that achieves a steady state signal level at XI or XO. The steady state CBA value in the settings may be updated during operation accordingly.

The controller 132 controls the CBA value to adjust the core bias current CB of the crystal amplifier 112, which is used to adjust the gain of the crystal amplifier 112. The gain of the crystal amplifier 112 modifies the level of negative resistance that is applied to the crystal 152 to establish and maintain oscillation of the crystal oscillator 154. In this manner, for the illustrated configuration used throughout this disclosure, the CBA value serves as a gain setting applied to a gain control input of the crystal amplifier 112 for adjusting amplifier gain. Alternative crystal oscillator configurations, however, are contemplated. Another possible implementation, for example, is to bias a crystal amplifier with a voltage and adjust the gain by adjusting the voltage.

The optimal settings 134 and the robust settings 136 may be determined beforehand in the laboratory for each of multiple crystals and crystal types that may be used by the wireless circuit 102. The optimal settings 134 are generally designed to ensure oscillation for the particular crystal or crystal type in the most efficient manner, such as providing only the level of core bias current necessary in a single phase or in each of multiple phases to establish and maintain oscillation with the required phase noise and PSR performance. Alternatively or in addition, the optimal settings 134 may be tweaked or adjusted for a specific crystal coupled to the wireless circuit 102 for further optimization.

The optimal settings 134, however, may be not be suitable to startup a "sleepy" crystal. In one embodiment, the amplifier core 118 may be optimized for a 40Ω crystal (normally having a maximum equivalent series resistance (ESR) of 40Ω). A sleepy crystal, however, may, temporarily, exhibit up to 5 times or more of the maximum ESR, such as up to 200Ω. The robust settings 136 are used when the crystal oscillator 154 fails to startup using the optimal settings 134. The robust settings 136 establish a greater level of negative resistance for starting up a sleepy crystal, such as increased level of core bias current, reduced capacitance of the tune capacitors C1 and C2, different amplitude thresholds, etc.

In a conventional configuration, rather than using optimal settings for efficient startup, settings similar to the robust settings have been used instead to ensure startup of a sleepy crystal. It has been determined, however, that a crystal becomes sleepy only once for a large number of startups, so that using more robust settings for every startup wastes a significant amount of energy during startup. Instead, in one embodiment the optimal settings 134 are used as a default for every startup to save energy. In the event of a startup failure due to a sleepy crystal, the crystal is restarted again using the robust settings 136 which may resolve the condition with little loss of performance over time. The robust settings 136 can be used once each time oscillation failure is detected, and then startup operation may return to the optimal settings 134. It is noted that the optimal settings 134 and/or the robust settings 136 may be adaptively adjusted as further described herein.

The controller 132 includes a timing circuit 138 for measuring the startup time of the crystal oscillator 154. In one embodiment, the timing circuit 138 may be implemented based on the internal timing functions of the controller 132. Alternatively, the timing circuit 138 may be implemented as a separate circuit. As described further herein, the controller 132 loads and/or resets the timing circuit 138 to begin counting elapsed startup time, and the controller 132 monitors LD from the level detector 130 to determine when the amplitude of the oscillation signal generated by the crystal oscillator 154 reaches a target level. Once the target level is reached, the controller 132 stops the timing circuit 138 (or a timer or counter of the timing circuit 138) or otherwise reads a new startup value $STARTUP_{NEW}$ from the timing circuit 138. The $STARTUP_{NEW}$ value may be stored into a register 141 located in the memory 110. As further described herein, the controller 132 uses $STARTUP_{NEW}$ to update a previously stored STARTUP value at a memory location 140 within the memory 110, or may otherwise adjust a first new startup value $STARTUP_{NEW}$ for storage as the first STARTUP value stored at the memory location 140. The controller 132 asserts a ready signal RDY to the processor 108 when the crystal oscillator 154 is oscillating at the target amplitude and is stable. The stored STARTUP value at memory location 140 is used by the processor 108 for timing subsequent startups as further described herein.

In one embodiment, a timeout value (TMO) may be stored at another memory location 142 in the memory 110 and used by the controller 132 to identify startup failure using the optimal settings 134. The memory location 142 may be non-volatile memory, flash memory, or a register setting or the like. Alternatively, TMO may be hardcoded into the timing circuit 138 or provided from an external source. TMO represents an excessive amount of time indicating that the crystal oscillator 154 has failed to startup. If TMO is reached before LD is asserted indicating oscillation failure, then the controller 132 retrieves the robust settings 136 and attempts to restart the crystal oscillator 154 using the robust settings 136. Once started, the controller 132 retrieves and stores the optimal settings 134 back into the settings memory 135 as the default startup settings for subsequent startup events.

In one embodiment, the wireless circuit 102 further includes a wakeup (WAKEUP) circuit 144 that is programmed by the processor 108. As shown, the processor 108 programs the WAKEUP circuit 144 with a wakeup delay value WDEL. WDEL is based on the next scheduled startup time and further based on STARTUP determined by the processor 108. The WAKEUP circuit 144 asserts a wakeup signal WUP to wake up the wireless circuit 102, in which WUP is provided to the controller 132. The wakeup circuit 144 may be implemented as a timer circuit or the like that asserts WUP based on the wakeup delay WDEL programmed by the processor 108. Although WUP is shown provided by the WAKEUP circuit 144 directly to the controller 132 for simplicity, it may instead be provided to the power controller or power sequencer which in turn wakes up components of the wireless circuit 102 including the processor 108 and the controller 132.

The controller 132 may update STARTUP according to any one of several different methods as further described herein. In one implementation, STARTUP is determined once during a first boot or POR and used thereafter for subsequent startups. In other implementations, STARTUP is periodically updated, such as after each startup or after every Nth startup in which N is programmable, so that STARTUP is adjusted over time. In other implementations, STARTUP is determined and used for subsequent startups and only adjusted when the temperature changes by a significant amount. As shown, a temperature value TMP is provided so that the controller 132 may monitor the temperature and temperature changes over time. TMP may be provided by a local temperature sensor (not shown) or may be provided from an external source.

Figure 2:
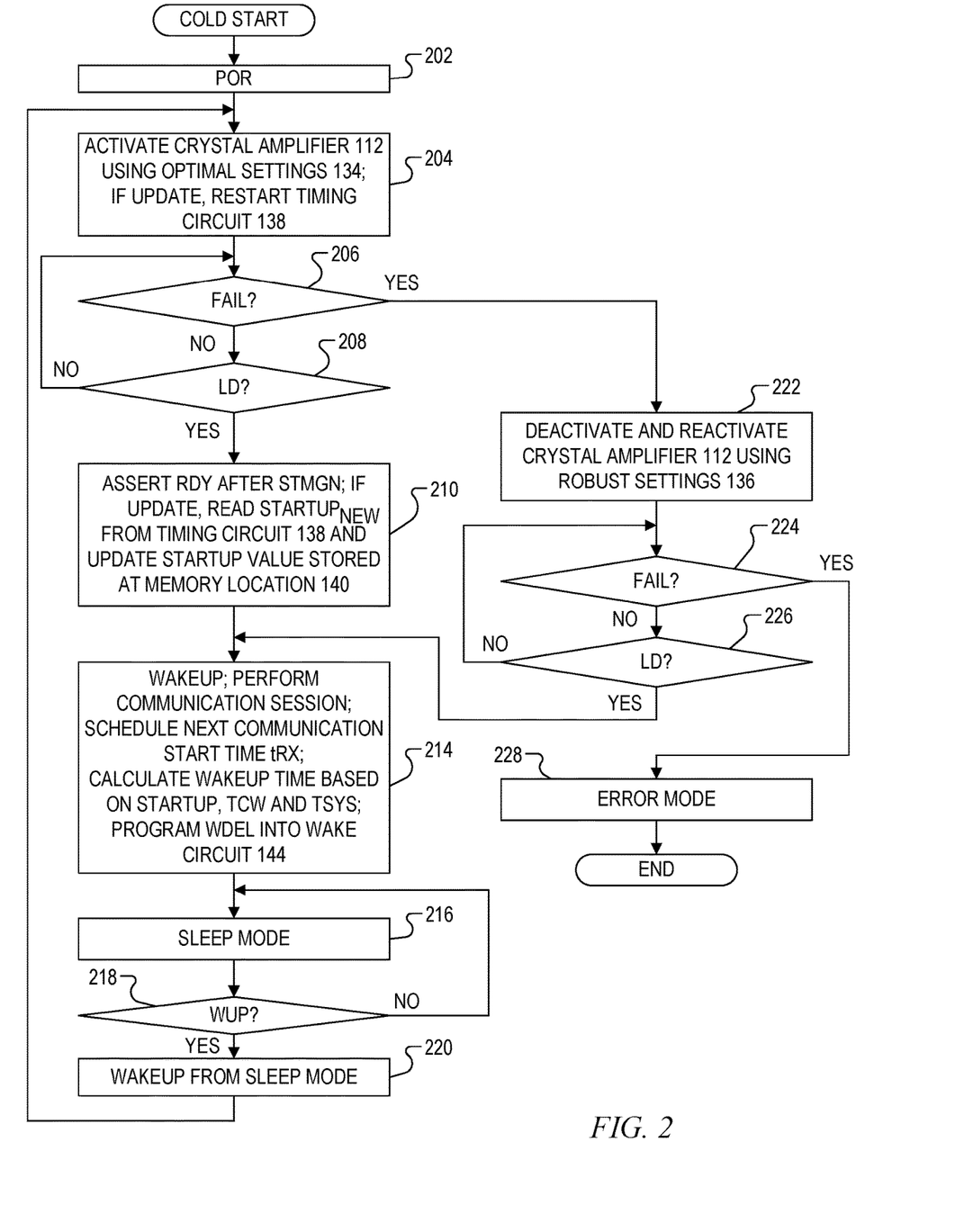
FIG. 2 is a flowchart diagram illustrating operation of the wireless device of FIG. 1 according to one embodiment.

FIG. 2 is a flowchart diagram illustrating operation of the wireless device 100 according to one embodiment. Operation begins with a "cold" start at block 202 upon initial power up or reset (POR) of the wireless circuit 102. The processor 108 may perform an initialization or boot-up routine and then transition to a normal operating routine or application. The controller 132 may also be powered up and initialized, which may include retrieving and storing the optimal settings 134 into the settings memory 135. Once the settings memory 135 is programmed with the optimal settings 134, subsequent wakeup time of the controller 132 is significantly reduced.

At next block 204, the controller 132 activates the crystal amplifier 112 using the optimal settings 134. Also, if an update to STARTUP is indicated by the controller 132 as further described herein, the timing circuit 138 is restarted or otherwise reset to begin tracking elapsed time. At next block 206, the controller 132 monitors a FAIL signal indicating whether oscillation has failed, in which the FAIL signal is asserted when the timing circuit 138 reaches the timeout value TMO before LD is asserted. TMO represents a maximum timeout which indicates that the crystal oscillator 154 has failed to startup within a predetermined maximum amount of time. At next block 208, the controller 132 monitors LD which is asserted by the level detector 130 when the crystal oscillator 154 is oscillating at the target amplitude suitable for establishing a reference frequency for the clock circuit 126 to enable wireless communications. Operation loops between blocks 206 and 208 until either FAIL or LD is asserted.

Assuming that LD is asserted before FAIL, operation advances to block 210 in which the controller 132 asserts RDY to indicate successful startup of the crystal oscillator 132 after a startup time margin STMGN. STMGN is a small timing margin from when LD is asserted indicating that the target amplitude has been reached until the oscillation signal has stabilized. It is noted that in some configurations STMGN may not be added or may simply be zero. If an update to STARTUP is indicated, then controller 132 reads the new start time value $STARTUP_{NEW}$ from the timing circuit 138 and updates the STARTUP value stored at the memory location 140. Various methods are contemplated for updating STARTUP with a newly measured startup time STARTUP$_{NEW}$ as further described herein, such as comparing and updating, digital averaging, statistical analysis, one-time adjustment, changes in temperature, etc. It is noted that if the actual startup time is greater than the stored STARTUP value such that the crystal oscillator 154 is not ready in time, one or more communication packets may be dropped during the current communication session. A few dropped packets over time is relatively inconsequential, and the wireless circuit 102 may adjust over time to minimize dropped packets.

At next block 214, the processor 108 wakes up if previously placed into a sleep mode in response to detecting assertion of the RDY signal, performs an RX/TX communication session (or other operation using the crystal oscillator 154), and schedules the next session. In the first iteration after POR, wakeup is not necessary; instead the processor 108 may announce the device in a wireless network according to the appropriate wireless protocol. After the processor 108 establishes wireless communications in the wireless network, a subsequent start time tRX is scheduled for the next RX/TX communication session which means that the oscillation signal must be stable having the correct frequency and amplitude no later than the time indicated by tRX. The processor 108 then determines a wakeup time delay ahead of the scheduled communication time taking into account the STARTUP value stored the memory 110. The processor 108 adds STARTUP to a delay time TCW for waking up the controller 132, and also adds an additional system delay time TSYS to enable the wireless system to prepare for RX/TX communications. In this manner, the processor 108 adds STARTUP, TCW and TSYS as a total system delay, and subtracts the total system delay from the startup time tRX to determine the wakeup delay value WDEL programmed into the WAKEUP circuit 144. It is noted that since the processor 108 may insert a delay after RDY, e.g., TSYS, that the small startup stabilizing margin STMGN added in block 210 may not be necessary or otherwise may be zero.

It is noted that the WAKEUP circuit 144 may also start other blocks needed by the system for the communication session, like a Synthesizer or other. These blocks could also be started during block 210 depending on the length of their startup time and whether they need a completely stable oscillation signal or may successfully use an oscillation signal that is still stabilizing.

After the WAKEUP circuit 144 is programmed, the processor 108 (or other power device) places the wireless circuit 102 into the sleep mode at next block 216. Operation loops between blocks 216 and 218 during sleep mode waiting for WUP to be asserted. When WUP is asserted, operation advances to block 220 in which the wireless circuit 102 is awakened from the sleep mode. As noted above, since the settings memory 135 has already been programmed with the optimal settings 134, the controller 132 awakens in a relatively short amount of time. Operation returns to block 204 in which the controller 132 activates the crystal amplifier 112 based on the optimal settings 134, and may also restart the timing circuit 138 if an update to STARTUP is indicated. Assuming successful startup of the crystal oscillator 154, RDY is asserted and a new STARTUP value is determined and/or stored at the memory location 140 as indicated at block 210. Operation loops between blocks 204 and 220 for subsequent wakeup events and scheduled RX/TX communication sessions.

Presumably, since STARTUP is based on actual measurement(s) of the amount of time to establish oscillation by the crystal oscillator 154, very little additional time is wasted waiting for the crystal oscillator 154 to startup ahead of time. Essentially, STARTUP provides a just-in-time startup delay for the particular crystal 152 and IC combination with only minimal margin for error and with optional temperature compensation. In this manner, rather than spending a substantial amount of time in the laboratory determining startup times for multiple crystals with wide variances for determining an appropriate time margin for a worst case startup time and having to consider aging, the startup time is actually measured and used to minimize startup time and reduce power consumption.

In the event of a sleepy crystal in which the optimal settings 134 are not sufficient for successful startup of the crystal oscillator 154, the timing circuit 138 reaches TMO and FAIL is asserted before LD indicating oscillation failure as determined at block 206. In this case, operation instead advances to block 222 in which the controller 132 retrieves the robust settings 136 from the memory 110, and deactivates and then reactivates the crystal amplifier 112 using the robust settings 136 or otherwise applies the robust settings during the current operation. As previously described, the robust settings 136 further increase the magnitude of the negative resistance of the crystal amplifier 112 and may also reduce the threshold requirements to ensure startup of the crystal oscillator 154 even when the crystal 152 is sleepy. Operation advances to successive inquiry blocks 224 and 226 in which the controller 132 monitors FAIL and LD in a similar manner as previously described. Assuming LD is asserted before FAIL as determined at query block 226, operation returns to block 214 of the main loop to perform the next wireless communication session. In one embodiment, if the optimal settings 134 are overwritten by the robust settings 136 in the settings memory 135, then after successful startup, the optimal settings 134 may be re-loaded into the settings memory 135 for subsequent startup events (until a next time when the crystal oscillator 154 may fail to start). Alternatively, the robust settings 136 may not be stored into the settings memory 135 since used on a relatively infrequent basis.

If for any reason FAIL is asserted before LD is asserted as determined at block 224, operation advances to block 228 in which the wireless circuit 102 enters an error mode or the like. In this case the crystal oscillator 154 failed to start using the robust settings 136, so that the wireless device 100 may have failed or may otherwise be unable to perform wireless communications or other operations using the crystal oscillator 154. Alternatively or in addition, if the robust settings 136 fail to start a sleepy crystal once or a certain number of times, then the error mode 228 may be used to instruct the controller 132 to adjust or strengthen the robust settings 136 and attempt startup again. In one embodiment, the controller 132 may incrementally or gradually adjust the robust settings 136 and attempt re-start any number of times to achieve successful startup. Alternatively, the multiple sets of robust settings 136 may be stored and used in the alternative, or one or more parameters of the stored robust settings 136 may include multiple values in which more aggressive settings may be used in the event of one or more oscillation failures. If the crystal oscillator 154 fails to start using maximum robust settings, then an error condition is determined.

In addition, the controller 132 may keep track the number of times block 222 is performed (application of robust settings) relative to the number of total startups over time, and in the event the count becomes excessive or is significantly beyond what is expected for sleepy crystals, then the controller 132 may adjust the optimal settings 134 to increase likelihood of successful startup during normal operation. In this case, for example, failure may be caused by sub-optimal settings in the optimal settings 134 rather than because of a sleepy crystal.

Figure 3:
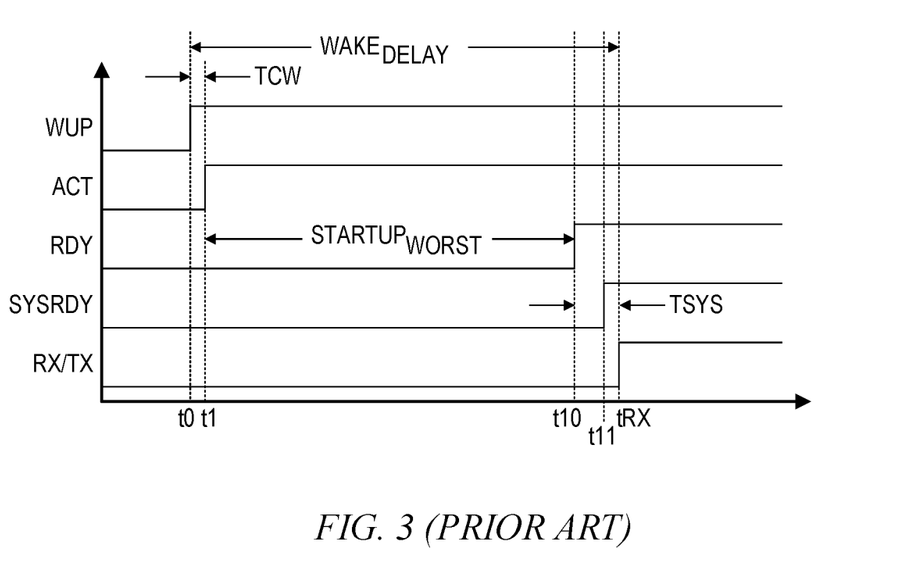
FIG. 3 is a timing diagram illustrating startup timing of a wireless device implemented according to a conventional configuration in which the startup time of the crystal oscillator is not measured.

FIG. 3 is a timing diagram illustrating startup timing of a wireless device implemented according to a conventional configuration in which the startup time of the crystal oscillator 154 is not measured. The timing diagram plots signals WUP, ACT, RDY, SYSRDY and RX/TX versus time. WUP is asserted at a time t0 to wakeup the controller 132. ACT represents an activation start time asserted at a time t1 when the controller 112 activates the crystal amplifier 112. The delay time TCW from time t0 to t1 represents a wakeup time for the controller 132. RDY is the ready signal asserted by the controller 132 to the processor 108 at a subsequent time t10 when the crystal oscillator 154 should be stable based on a predetermined worst case startup time $STARTUP_{WORST}$ in response to ACT being asserted at time t1. According to the conventional configuration, the controller 132 does not measure the actual startup time but instead assumes the worst case startup time $STARTUP_{WORST}$ beginning when the crystal oscillator 154 is activated. SYSRDY is asserted at a subsequent time t11 in response to RDY being asserted representing the communication system 101 completing its wakeup process including the processor 108 in preparation for performing a scheduled communication or other scheduled operation.

It is noted that some circuits or modules may be started in parallel with the controller 132 and the crystal oscillator 154 in response to WUP. The processor 108 can consume a significant amount of power and, in that case, should be awakened at the latest possible time to conserve power. The RX/TX signal is asserted at the schedule communication time tRX soon after SYSRDY is asserted indicating commencement of RX/TX communications. The delay from T10 to tRX is shown as the system delay time TSYS.

The total time from t0 to tRX is a wakeup delay time $WAKE_{DELAY}$ from when the WAKEUP circuit 144 asserts WUP to the scheduled time for RX/TX communications. The processor 108 previously determined the $WAKE_{DELAY}$ delay time based on the predetermined $STARTUP_{WORST}$ time, subtracted the $WAKE_{DELAY}$ delay time from the scheduled start time tRX, and programmed a corresponding wakeup value WDEL into the WAKEUP circuit 144 to wake the system at time t0. In order to determine the $WAKE_{DELAY}$ delay time, the processor 108 added the known delay time TCW for waking up the controller 132 (from t0 to t1), the predetermined $STARTUP_{WORST}$ time from t1 to t10, and the known time TSYS (from t10 to tRX) to allow the system to prepare for RX/TX communications. Even though the crystal oscillator 154 may be stable well before the scheduled time tRX, the worst case startup time $STARTUP_{WORST}$ is assumed resulting in significantly longer startup times for most typical wireless devices.

Figure 4:
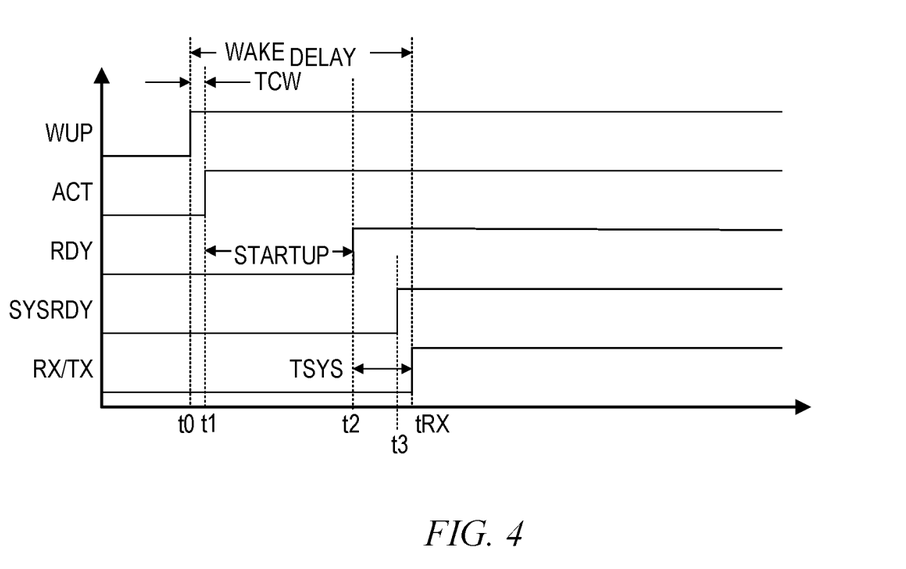
FIG. 4 is a timing diagram illustrating startup timing of the wireless circuit of FIG. 1 according to one embodiment in which the startup time of the crystal oscillator is measured and used to determine an optimal wakeup time.

FIG. 4 is a timing diagram illustrating startup timing of the wireless circuit 102 according to one embodiment in which the startup time of the crystal oscillator 154 is measured and used to determine an optimal wakeup time. The timing diagram plots signals WUP, ACT, RDY, SYSRDY and RX/TX signals versus time in the same manner as shown in FIG. 3. Similar to the conventional case, in a prior communication session the processor 108 determines the next scheduled communication start time tRX, calculates a $WAKE_{DELAY}$ delay time, and programs the corresponding WDEL value into the WAKEUP circuit 144. In this case, however, the processor 108 uses the STARTUP value retrieved from the memory 110 to calculate the $WAKE_{DELAY}$ delay time rather than $STARTUP_{WORST}$. The processor 108 adds TCW and TSYS to STARTUP to calculate the new $WAKE_{DELAY}$ delay time.

WUP is asserted at time t0 to wakeup the controller 132, and ACT is asserted at time t1 after TCW in the same manner as shown in FIG. 3. In this case, however, RDY is asserted a subsequent time t2 after STARTUP rather than $STARTUP_{WORST}$. SYSRDY is asserted subsequently at time t3, and RX/TX is then asserted at subsequent time tRX which is the scheduled time for RX/TX communications. In this case, the predetermined $STARTUP_{WORST}$ time is replaced by STARTUP, which may be substantially smaller than $STARTUP_{WORST}$ since based on actual measurement rather than worst case conditions. The new $WAKE_{DELAY}$ delay time based on STARTUP enables the processor 108 to program the WAKEUP circuit 144 with WDEL to awake the wireless device 100 just-in-time for the next programmed communication session. As compared to the conventional configuration shown in FIG. 3, the wakeup time may be scheduled significantly later to minimize energy as compared to the conventional configuration.

Figure 5:
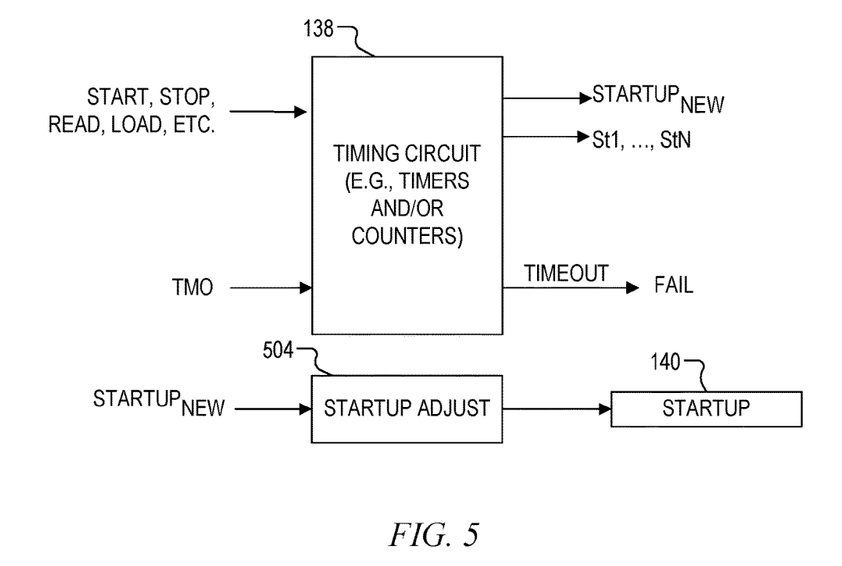
FIG. 5 is a block diagram illustrating a configuration of the timing circuit for measuring the startup time and operation of the controller of FIG. 1 for updating STARTUP according to one embodiment.

FIG. 5 is a simplified block diagram illustrating a configuration of the timing circuit 138 according to one embodiment. The illustrated timing circuit 138 may include one or more timers and one or more counters or the like such as is common in digital circuits. The timing circuit 138 may be used for measuring elapsed time, such as a new startup time $STARTUP_{NEW}$. To facilitate measuring elapsed time, the controller 132 may issue one or more commands to the timing circuit 138, such as START, STOP, READ, LOAD, etc., such as starting a timer or counter upon activation of the of the crystal oscillator 154 and stopping or reading the value in the timer or counter in response to assertion of LD or the like. Each newly measured $STARTUP_{NEW}$ value may be stored into the register 141 and used to update STARTUP stored at the memory location 140. The timing circuit 138 may be used to identify startup failure, such as by loading TMO into a countdown timer or the like which times out and asserts a FAIL signal indicating failure of oscillation since oscillation is not achieved within the maximum allowed time period TMO. As previously described, TMO may instead be a hardwired value in the timing circuit 138 or externally provided. The configuration of the timing circuit 138 is exemplary only and many different configurations for measuring time periods are contemplated.

$STARTUP_{NEW}$ may be used by a startup adjust operation 504 executed by the controller 132 to adjust the stored value STARTUP. As previously described, various factors may contribute to changes in the measured $STARTUP_{NEW}$ from one startup to another. One significant factor, for example, is temperature change having an impact on the timing of the crystal amplifier 112. It may be desired to measure $STARTUP_{NEW}$ periodically, such as every startup or every Nth startup, and adjust STARTUP based on each new measurement.

Figure 6:
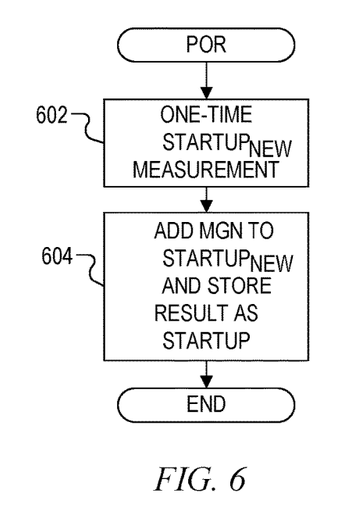
FIGS. 6-11 are flowchart diagrams illustrating operation of the controller performing the startup adjust operation of FIG. 5 according to various embodiments, including adding a time margin to the startup time, adjusting the startup time in response to temperature change, adjusting up or down based on remeasured startup times, averaging the startup time with or without adjustment based on temperature, and adjusting the startup time based on statistical analysis.

FIG. 6 is a flowchart diagram illustration operation of the controller 132 performing the startup adjust operation 504 according to one embodiment. In this relatively simple embodiment, upon the very first POR the timing circuit 138 is used for a one-time measurement of $STARTUP_{NEW}$ as shown at block 602. Then the controller 132 adds a margin (MGN) value to $STARTUP_{NEW}$ (or adjusts by a time margin) and stores the result as STARTUP at the memory location 140 as shown at block 604, and operation is completed. In this case, STARTUP is not subsequently updated but is nonetheless used for subsequent startups thereafter. Thus, the margin value MGN added at block 604 should be sufficiently large to account for startup time variations over time, including changes in temperature over the entire operating temperature range. In one embodiment, for example, MGN may be at least 10% of the measured STARTUP$_{NEW}$, but could be as much as 25% or 50% of STARTUP$_{NEW}$ depending upon the particular implementation, expected temperature range, and expected impact of temperature.

The benefit of the embodiment of FIG. 6 is simplicity, although the startup time is not necessarily minimized. Nonetheless, in most configurations the measurement of startup time and margin adjustment allows faster startup as compared to the worst case startup time STARTUP$_{WORST}$ previously described.

Figure 7:
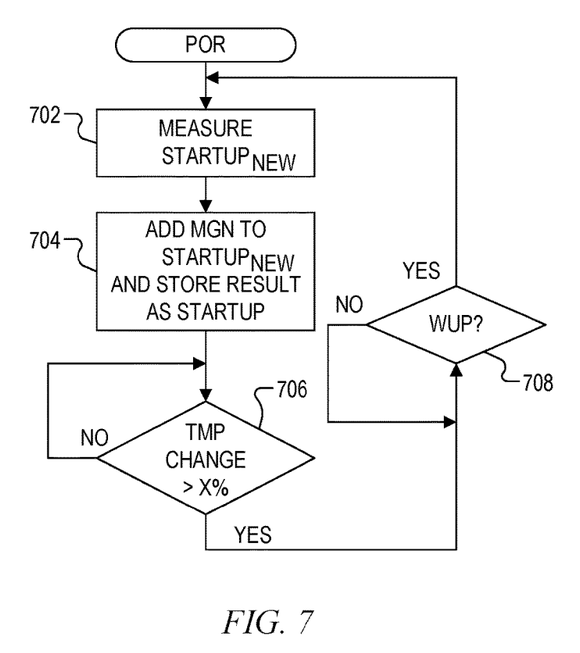

FIG. 7 is a flowchart diagram illustrating operation of the controller 132 performing the startup adjust operation 504 according to another embodiment. Upon each POR, the timing circuit 138 is used to measure STARTUP$_{NEW}$ upon startup as shown at block 702. Then the controller 132 may add a margin (MGN) value to STARTUP$_{NEW}$ and store the result as STARTUP at the memory location 140 as shown at block 704. Operation then advances to block 706 to query the change in temperature as indicated by a change of the TMP value. If TMP changes more than a predetermined percentage, shown as TMP change >% X in which "X" is set to a predetermined percentage value, then operation advances to block 708 to wait for the next wakeup indicated by WUP. When WUP is next asserted upon the next wakeup, operation returns to block 702 to repeat the process in which STARTUP$_{NEW}$ is measured again to update STARTUP. The updated STARTUP value is then used for the next startup and thereafter until temperature changes again by the predetermined percentage X %. STARTUP is not updated as long as TMP does not change by the indicated amount at block 706.

As compared to the embodiment of FIG. 6, the MGN may be a significantly smaller value or even zero since it does not have to account for significant temperature change. Instead, temperature change is compensated since STARTUP is updated when the temperature change is greater than the predetermined amount. The value X may be a fixed value or may be a programmable value. As an example, X may represent a significant temperature change such as, for a non-limiting example, 20%. In an alternative embodiment, rather than a percentage temperature change, the change may be represented as a particular temperature offset value, such as a change by X degrees Celsius (e.g., X° C.). As a non-limiting example, X could be 20° C. or the like.

Figure 8:
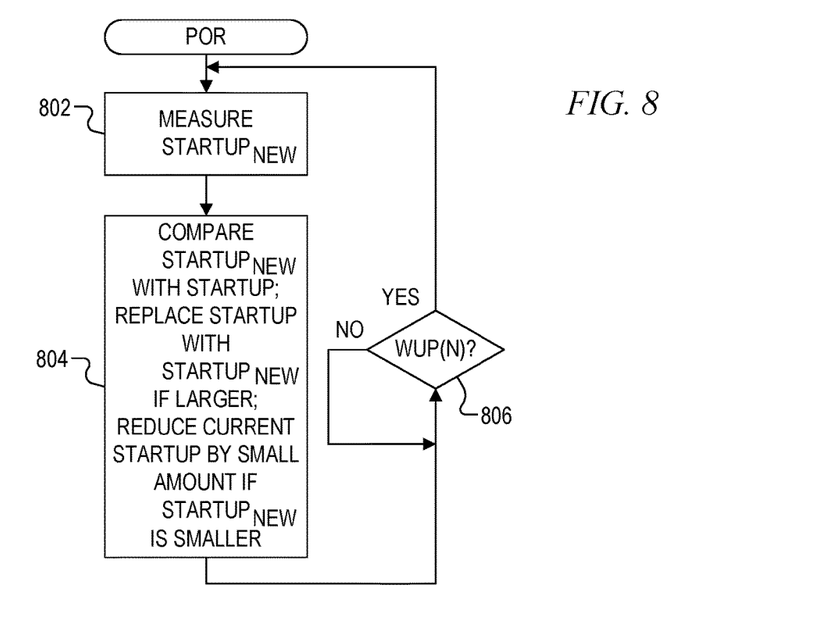

FIG. 8 is a flowchart diagram illustrating operation of the controller 132 performing the startup adjust operation 504 according to yet another embodiment. Upon POR, the timing circuit 138 is used to measure STARTUP$_{NEW}$ upon startup as shown at block 802. At next block 804, the controller 132 compares the newly measured STARTUP$_{NEW}$ with the stored startup value STARTUP. The STARTUP value is replaced by the newly measured STARTUP$_{NEW}$ only if STARTUP$_{NEW}$ is larger. Otherwise, STARTUP is reduced by a small amount (e.g., 2% as a non-limiting example) if STARTUP$_{NEW}$ is smaller than the current STARTUP value. If the current and newly measured STARTUP values are equal or sufficiently close, then there is no change. In this manner, if the startup time has increased or is otherwise increasing over time, then STARTUP is increased accordingly to the largest startup time, but if the startup time is decreasing over time, then STARTUP is gradually decreased. In this manner, STARTUP is adjusted on a periodic basis to follow the actual startup time.

Operation then advances to block 806 to wait for the Nth wakeup indicated by WUP(N). In this case, WUP(N) is intended to mean that operation does not proceed until after N wakeup times. E.g., if N is 1, then WUP(N) is true upon each wakeup, or if N is 5, then WUP(N) is true only after every $5^{th}$ wakeup. When WUP(N) is true, operation returns to block 802 to repeat the process in which STARTUP$_{NEW}$ is measured again upon the next startup and used to update STARTUP. Operation loops in this manner to update STARTUP over time. It is noted that although a time margin may be added to STARTUP, such time margin may be relatively small or even zero since STARTUP is updated on a periodic basis, such as every wakeup or every Nth wakeup in which N is selected to accurately track startup over time. Although temperature change may also be included as a trigger to adjust STARTUP, it is adjusted on a regular basis and thus inherently incorporates adjustments in response to changes in temperature.

Figure 9:
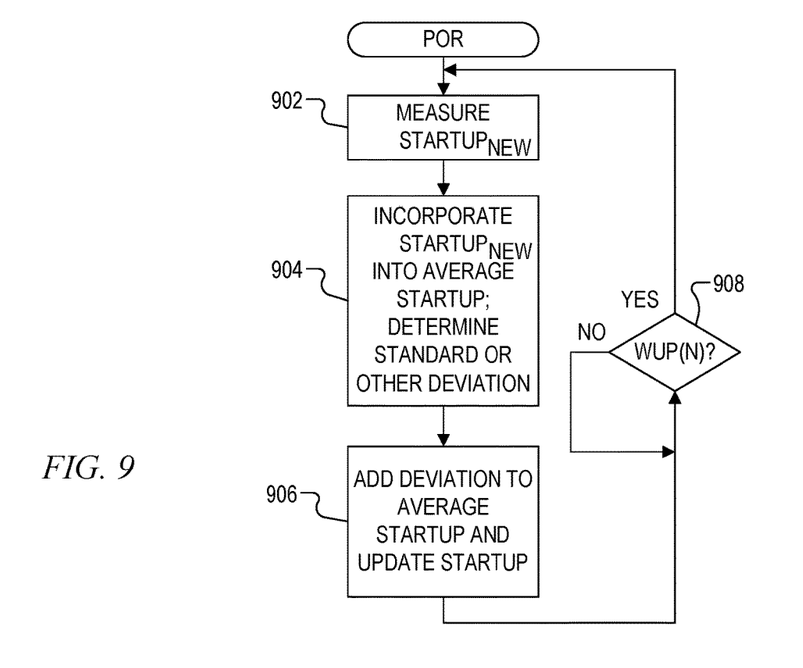

FIG. 9 is a flowchart diagram illustrating operation of the controller 132 performing the startup adjust operation 504 according to another embodiment in which the startup time is averaged over time. Upon POR, the timing circuit 138 is used to measure a new startup time STARTUP$_{NEW}$ as shown at block 902. At next block 904, the controller 132 incorporates the new STARTUP$_{NEW}$ into STARTUP, which is an average of previously measured startup times. Such averaging may be according to any one or more methods. In one embodiment, the average value is the average of all measured startup values since POR. This configuration may include a running count of the total number of startup events. In another embodiment, STARTUP is running or moving average value of a fixed window of startup events, such as the last 10 or 20 startup measurements. Also, a standard deviation or other statistical deviation is determined at block 904. At next block 906, the controller 132 adds the standard or other statistical deviation to the averaged STARTUP value and the result is stored as STARTUP. Operation then advances to block 908 to wait for the Nth wakeup indicated by WUP(N) in a similar manner as described for FIG. 8. Operation loops in this manner to update STARTUP over time.

Figure 10:
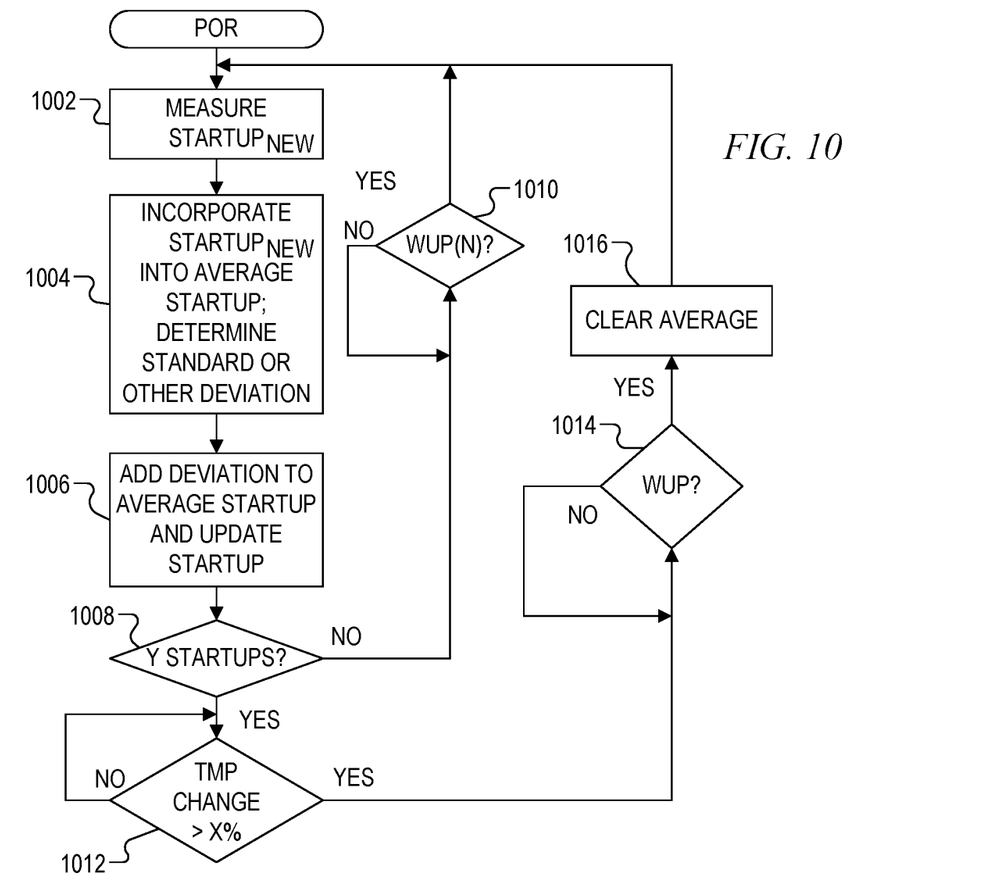

FIG. 10 is a flowchart diagram illustrating operation of the controller 132 performing the startup adjust operation 504 according to another embodiment in which the startup time is averaged only up to a predetermined number of startup events. Upon POR, the timing circuit 138 is used to measure a new startup time STARTUP$_{NEW}$ as shown at block 1002, and then at block 1004, the controller 132 incorporates the STARTUP$_{NEW}$ into the current averaged value of STARTUP and determines a standard deviation or other statistical deviation in similar manner previously described, and then updates STARTUP at next block 1006. In this case, operation proceeds to block 1008 to query whether a number "Y" startups (or STARTUP$_{NEW}$ values) have been averaged. The number Y is selected to incorporate a sufficient number of measured startup times to obtain a good average value, such as 25, 50, 100, etc., averaged values. If Y has not been reached, operation loops to block 1010 to wait for the Nth wakeup indicated by WUP(N) as previously described. Again, N may be any suitable number including 1. After N startups, operation returns to block 1002 to measure and incorporate the STARTUP$_{NEW}$ into the averaged STARTUP value, and operation continues to loop between blocks 1002 and 1010 until Y startup times have been averaged.

Once Y STARTUP$_{NEW}$ have been averaged as determined at block 1008, operation proceeds instead to block 1012 to inquire whether the temperature as indicated by TMP has changed by more than a predetermined percentage (% X, or by a set temperature value, e.g., X° C.) in a similar manner as previously described. In other words, the average value is used until the temperature changes by a significant amount. When the temperature has changed as determined at block 1012, operation proceeds to block 1014 to wait for the next wakeup as indicated by WUP. Upon the next wakeup, operation advances to block 1016 in which the current average value is cleared, and then operation returns to block 1002 to measure a new STARTUP$_{NEW}$ and start a new average of the next Y STARTUP$_{NEW}$ values. Operation repeats in this manner to obtain an newly averaged value of Y startup times for the changed temperature.

Figure 11:
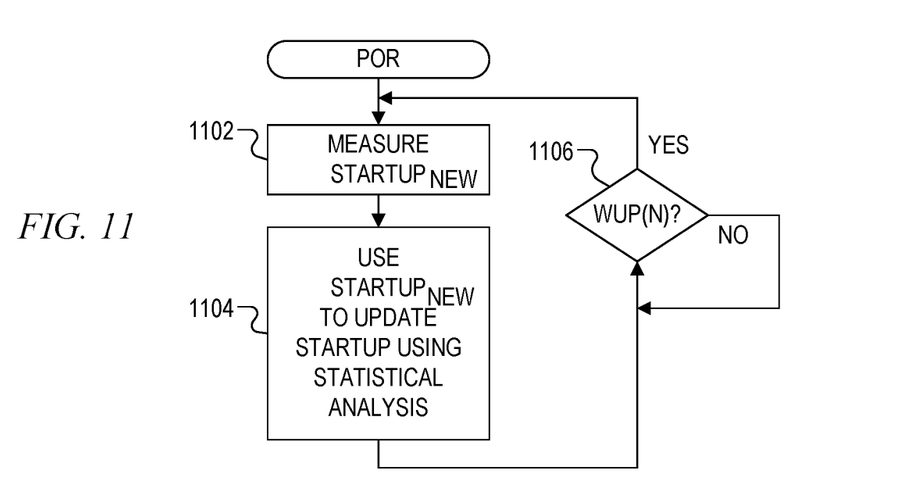

FIG. 11 is a flowchart diagram illustrating operation of the controller 132 performing the startup adjust operation 504 according to a more generalized statistical analysis embodiment. Upon POR, the timing circuit 138 is used to measure a new startup value STARTUP$_{NEW}$ upon startup as shown at block 1102, and then operation advances to block 1104 in which the newly measured STARTUP$_{NEW}$ is used to update STARTUP using statistical analysis. Many different statistical evaluation techniques are known and contemplated for updating STARTUP over time. Also, any time margin may be added if desired. Operation then advances to block 1106 to wait for the Nth wakeup indicated by WUP(N), and then back to block 1102 to measure the next STARTUP$_{NEW}$ value.

In one statistical configuration, for example, a large margin may be added to a first newly measured STARTUP$_{NEW}$ to determine an initial STARTUP value, in which the added margin is gradually adjusted, e.g., reduced, over time and multiple new startup measurements. STARTUP may initially settle to a steady state value that is valid for a very large number of startup events. Thereafter, as the newly measured startup times gradually decrease or increase for any reason, such as changes in temperature or with age, STARTUP is nudged towards the trending startup measurements to remain accurate over time.

When the memory 110 includes a writable non-volatile memory, the STARTUP time that is determined during operation can be saved to be restored when RAM retention is lost as this would be a better starting point. On a new POR event the saved STARTUP can be restored and used as a starting point with or without added margin to be used while new statistical data is being gathered. In one embodiment, all of the data samples the statistical algorithm being used are preloaded with the loaded value and then as new samples are gathered the repeated loaded values are flushed and the new samples determine STARTUP. As an alternative, or during the first ever boot up, a fixed, potentially very conservative value can be used.

Additional embodiments contemplate a combination of one or more of these techniques shown and described in FIGS. 6-11, in which a user may program one or more settings to select an option. In addition, if the currently determined value of STARTUP becomes inaccurate over time, it may be simply discarded in favor of new STARTUP$_{NEW}$ measurements and STARTUP updates.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An oscillation circuit that is capable of driving an externally coupled crystal to oscillate at a resonant frequency, comprising:
   a crystal interface for coupling to the crystal;
   a crystal amplifier coupled to said crystal interface that is capable of driving the crystal when activated to initiate and maintain oscillation;
   a level detector having an input coupled to said crystal interface and having an output, wherein said level detector is capable of providing an oscillation indication at said output when a target amplitude is detected at said input;
   a timing circuit; and
   a controller that is capable of activating said crystal amplifier, that is capable of using said timing circuit and said level detector to measure a startup time of oscillation at said crystal interface, and that is capable of calculating a wake up time for the oscillation circuit.

2. The oscillation circuit of claim 1, further comprising a memory, wherein said controller is capable of storing said startup time and using said stored startup time to calculate a wakeup time for subsequent wake up events.

3. The oscillation circuit of claim 2, wherein said controller is capable of adding a time margin to said measured startup time and storing a result as said stored startup time.

4. The oscillation circuit of claim 2, wherein said controller is capable of re-measuring and updating said stored startup time upon detecting a temperature change by a predetermined amount.

5. The oscillation circuit of claim 2, wherein said controller replaces said stored startup time with a newly measured startup time when said newly measured startup time is greater than said stored startup time, and wherein said controller can reduce said stored startup time when said newly measured startup time is less than said stored startup time by a predetermined margin.

6. The oscillation circuit of claim 2, wherein said controller averages a plurality of measured startup times for updating said stored startup time.

7. The oscillation circuit of claim 1, further comprising a memory, wherein said controller is capable of retrieving optimal settings stored in said memory and of applying said optimal settings to said crystal amplifier to control activating the crystal.

8. The oscillation circuit of claim 7, wherein said controller is capable of using said timing circuit to detect when said oscillation indication is not provided within a predetermined timeout period, and wherein said controller is capable of retrieving robust settings stored in said memory and of applying said robust settings to said crystal amplifier to control activating the crystal.

9. A wireless device, comprising:
   a memory;
   a wakeup circuit;
   an oscillation circuit, comprising:
      a crystal oscillator comprising a crystal and a crystal amplifier that is capable of driving said crystal when activated to establish oscillation;

a level detector having an input coupled to said crystal and having an output, wherein said level detector is capable of providing an oscillation indication at said output when a target amplitude is detected at said input;

a timing circuit; and a controller that is capable of activating said crystal amplifier, of using said timing circuit and said level detector to measure a startup time of said crystal oscillator, and of storing said startup time into said memory; and a processor that programs said wakeup circuit with a wakeup value based on a scheduled communication session time and said stored startup time.

10. The wireless device of claim 9, wherein said controller is capable of adding a time margin to said measured startup time to provide an adjusted startup time, and of storing said adjusted startup time into said memory as said stored startup time.

11. The wireless device of claim 9, wherein said controller is capable of updating said stored startup time based on newly measured startup times during subsequent wakeup events, and wherein said processor is capable of using said stored startup time to determine said wakeup value.

12. The wireless device of claim 11, wherein said controller is capable of replacing said stored startup time with a newly measured startup time when said newly measured startup time is greater than said stored startup time, and wherein said controller is capable of reducing said stored startup time by an incremental amount when said newly measured startup time is less than said stored startup time by a predetermined margin.

13. The wireless device of claim 11, wherein said controller is capable of determining an averaged startup time using a plurality of measured startup times and of storing said averaged startup time as said stored startup time.

14. The wireless device of claim 9, wherein said controller is capable of detecting temperature, and of remeasuring and updating said stored startup time when temperature changes by a predetermined amount.

15. The wireless device of claim 9, wherein said controller is capable of using optimal settings stored in said memory for activating said crystal oscillator, wherein said controller is capable of using a timeout value to determine when said oscillation circuit fails to startup, and wherein said controller is capable of using robust settings stored in said memory for activating said crystal oscillator in the event said crystal oscillator fails to startup using said optimal settings.

16. A method of minimizing startup time of a crystal oscillator in order to perform a scheduled operation, comprising:

activating the crystal oscillator;

determining a startup time by measuring a time from activation to when an indication is provided indicating that an oscillation signal of the crystal oscillator achieves a predetermined amplitude;

storing the startup time; and using the stored startup time to determine a delay value for programming a wakeup circuit.

17. The method of claim 16, further comprising adding a time margin to the measured start time to determine the stored startup time.

18. The method of claim 16, wherein said determining a startup time comprises averaging a plurality of measured startup times and storing an averaged startup time as the stored startup time.

19. The method of claim 16, further comprising remeasuring startup time and updating the stored startup time upon detecting a temperature change by a predetermined amount.

20. The method of claim 16, further comprising:

said activating the crystal oscillator comprising activating the crystal oscillator using optimal settings;

detecting when the crystal oscillator fails to startup; and when the crystal oscillator fails to startup, activating the crystal oscillator using robust settings.

\* \* \* \* \*